United States Patent
Tominaga et al.

(10) Patent No.: US 7,419,920 B2
(45) Date of Patent: Sep. 2, 2008

(54) METAL THIN FILM AND SEMICONDUCTOR COMPRISING A METAL THIN FILM

(75) Inventors: Koji Tominaga, Kyoto (JP); Kunihiko Iwamoto, Kyoto (JP); Toshihide Nabatame, Tokyo (JP)

(73) Assignees: HORIBA, Ltd. (JP); Rohm Co., Ltd. (JP); Renesas Technology Corp. (JP)

( * ) Notice: Subject to any disclaimer, the term of this patent is extended or adjusted under 35 U.S.C. 154(b) by 233 days.

(21) Appl. No.: 11/301,400

(22) Filed: Dec. 12, 2005

(65) Prior Publication Data

US 2006/0147627 A1 Jul. 6, 2006

(30) Foreign Application Priority Data

Dec. 13, 2004 (JP) ............... 2004-360464

(51) Int. Cl.
*H01L 21/31* (2006.01)
(52) U.S. Cl. ............... 438/778; 438/783; 438/785; 438/E21.28
(58) Field of Classification Search ............... 257/392, 257/408, E21.28; 438/778–785
See application file for complete search history.

(56) References Cited

U.S. PATENT DOCUMENTS

2002/0050306 A1* 5/2002 Nishiuchi et al. ........... 148/101
2004/0168627 A1* 9/2004 Conley et al. ................ 117/89

OTHER PUBLICATIONS

Mikko Ritala et al.; "Atomic Layer Deposition of Oxide Thin Films with Metal Alkoxides as Oxygen Sources"; Science; vol. 288; Apr. 14, 2000; pp. 319-321.
J. F. Conley, Jr., et al.; "Pulsed deposition of metal-oxide thin films using dual metal precursors"; Applied Physics Letters; vol. 84, No. 3; Jan. 19, 2004; pp. 398-400.

* cited by examiner

*Primary Examiner*—Dung A. Le
(74) *Attorney, Agent, or Firm*—Cantor Colburn LLP

(57) ABSTRACT

A metal oxide thin film may be obtained by providing a source gas and an oxidizer gas. The source gas may include a hydrolyzable metallic compound. The oxidizer gas may include a hydrate of a metal salt. The metal oxide thin film may be obtained by alternately feeding the source gas and the oxidizer gas into a reaction chamber in which a substrate is placed.

4 Claims, 7 Drawing Sheets

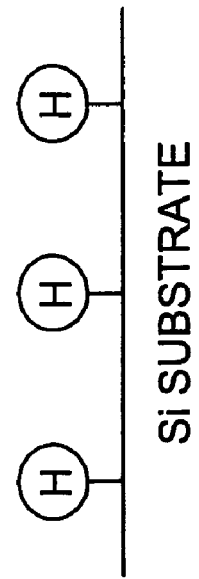
1 FEEDING SOURCE GAS
(IN THE CASE OF Hf[N(CH$_3$)$_2$]$_4$ FOR EXAMPLE)
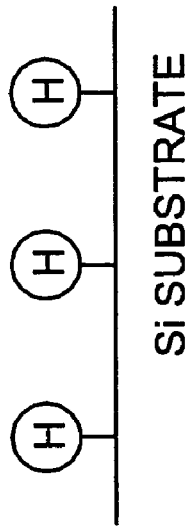
CONDITION OF SUBSTRATE
BEFORE FILM FORMATION
(HYDROGEN-TERMINATED)
FIG.3

METAL THIN FILM AND SEMICONDUCTOR COMPRISING A METAL THIN FILM

This application claims priority under U.S.C. § 119 to Japanese Patent Application No. 2004-360464 filed on Dec. 13, 2004, in the Japanese Patent Office, the entire contents of which is incorporated hereinto by reference.

BACKGROUND OF THE INVENTION

1. Field of the Invention

An embodiment of the present invention relates to a method of forming a metal oxide thin film including deposition of one monolayer by alternately feeding a source gas and an oxidizer gas to a substrate.

2. Description of the Related Art

In contrast to the CVD which is a method adapted to deposit a film continuously by incessant feed of materials, the atomic layer deposition method (hereinafter will be referred to as "ALD method") is a method of depositing individual films each comprising a single layer of a substance step by step and is excellent in deposition of a strictly controlled layer of high quality.

Known metal oxide film deposition methods utilizing the ALD method include: (1) a method of forming a metal oxide thin film by alternately feeding a source gas comprising a hydrolyzable metallic compound and an oxidizer gas (comprising $H_2O$ or $O_2$ for example); (2) a method using a metal chloride and a metal salt as a source gas and an oxidizer gas, respectively, to form a metal oxide film, specifically, using $Hf(NO_3)_4$ (hafnium nitrate) and $HfCl_4$ to form an $HfO_2$ film or using $Hf(NO_3)_4$ and $AlCl_3$ or $ZrCl_4$ to form an $HfAlO_x$ or $HfZrO_x$ film, as described in *Appl. Phy. Lett.* 84. P398 (2004); and (3) a method using such a chloride as $AlCl_3$, $HfCl_4$ or $SiCl_4$ and a metal alkoxide to form a compound metal oxide thin film (comprising $TiAlO_x$, $ZrAlO_x$, $HfAlO_x$, $ZrTiO_x$, $HfTiO_x$, or $ZrSiO_x$), as described in *SCIENCE* Vo.288 P319 (2000).

In depositing a compound metal oxide (comprising two or more kinds of metal oxide) by the conventional ALD method, the aforementioned method (1) needs to repeat six steps consisting of feed of metal gas A→gas purge→feed of oxidizer gas→gas purge→feed of metal gas B→gas purge→feed of oxidizer gas→gas purge. Thus, multiple gas feed steps are required, which results in a problem that the film deposition time taken by the ALD method, which essentially involves a film deposition speed problem, is further prolonged.

The aforementioned method (2) is capable of forming a compound metal oxide film (comprising $HfZrO_x$ for example) by repeating four steps consisting of feed of source gas (comprising a metal chloride, for example, $ZrCl_4$)→gas purge→feed of oxidizer gas (comprising a metal salt, for example, $Hf(NO_3)_4$)→gas purge. However, the method (2) can form only limited kinds of compound oxide because of the use of metal salt.

The aforementioned method (3) using a metal alkoxide involves a similar drawback that only limited kinds of metal alkoxide can be used as oxidizers and, hence, only limited kinds of compound metal oxide can be deposited as film because metal alkoxides inherently have high hydrolyzability.

Accordingly, it is an embodiment of the present invention to provide a method which can solve the foregoing problems at a time and which is capable of forming metal oxide thin films of diverse kinds including, in particular, a compound metal oxide thin film comprising different kinds of metal by utilizing the ALD method without affecting the film deposition speed.

SUMMARY OF THE INVENTION

According to an embodiment of the present invention, there is provided a method of forming a metal oxide thin film, comprising: providing a source gas comprising a hydrolyzable metallic compound and an oxidizer gas comprising a hydrate of a metal salt; and alternately feeding the source gas and the oxidizer gas into a reaction chamber in which a substrate is placed.

Since this method uses the source gas comprising a hydrolyzable metallic compound and the oxidizer gas comprising a hydrate of a metal salt, the method can form metal oxide thin films of diverse kinds serving many different purposes by taking advantage of the ALD method. If the metal contained in the source gas is different from that contained in the oxidizer gas, the metal oxide thin film formed by the method of an embodiment of the present invention is a compound metal oxide thin film. On the other hand, if the metal contained in the source gas is the same as that contained in the oxidizer gas, the metal oxide thin film formed by the method of an embodiment of the present invention is a single metal oxide thin film. Further, since the method of an embodiment of the present invention is capable of forming a thin film in four steps consisting of feed of the source gas→gas purge→feed of the oxidizer gas→gas purge like the conventional ALD method, the problem of a lowered film deposition speed will not arise.

Preferably, the comprises a hydrate of any one selected from the group consisting of a nitrate, a hydrochloride, a sulfate, and a perchlorate, as a major component thereof.

The use of a metal oxide thin film formed by the method of an embodiment of the present invention makes it possible to fabricate a semiconductor device of very high quality.

Metal oxide thin films which can advantageously be formed by the method of an embodiment of the present invention include a metal oxide thin film containing a lanthanoid metal.

An embodiment of the present invention also provides an apparatus for forming a metal oxide thin film which can realize the above-described method of an embodiment of the present invention, the apparatus comprising: a reaction chamber for placing a substrate therein; a source gas feed pipe connected to the reaction chamber for feeding a source gas thereto; an oxidizer gas feed pipe connected to the reaction chamber for feeding an oxidizer gas thereto; a purge gas feed pipe connected to the reaction chamber for feeding a purge gas thereto; valves each disposed at a respective one of the source gas feed pipe, the oxidizer gas feed pipe and the purge gas feed pipe; a controller configured to control switching of the valves such that the source gas and the oxidizer gas are alternately fed to the reaction chamber with intervening purging with the purge gas, wherein the source gas comprises a hydrolyzable metallic compound and the oxidizer gas comprises a hydrate of a metal salt.

As described above, an embodiment of the present invention, which uses the source gas comprising a hydrolyzable metallic compound and the oxidizer gas comprising a hydrate of a metal salt, makes it possible to form metal oxide thin films of diverse kinds serving different purposes, including, in particular, a compound metal oxide thin film comprising two different kinds of metal. Such a compound metal oxide thin film obtained by an embodiment of the present invention is of high quality with a precisely controlled thickness, which is an advantageous feature of the ALD method. For this reason, the compound metal oxide film can provide for a semiconductor device, for example, a MOS transistor having a gate insulator of high reliability and high quality. Moreover, since an embodiment of the present invention is capable of forming a thin film in four steps consisting of feed of the source gas→gas purge→feed of the oxidizer gas→gas purge, the problem of a lowered film deposition speed will not arise.

The foregoing and other features and attendant advantages of an embodiment of the present invention will become more apparent from the reading of the following detailed description of the invention in conjunction with the accompanying drawings.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIG. 3 is a schematic view illustrating a film forming step in the embodiment;

DETAILED DESCRIPTION OF THE PREFERRED EMBODIMENTS

Hereinafter, one embodiment of the present invention will be described in detail with reference to the accompanying drawings.

Figure 1:
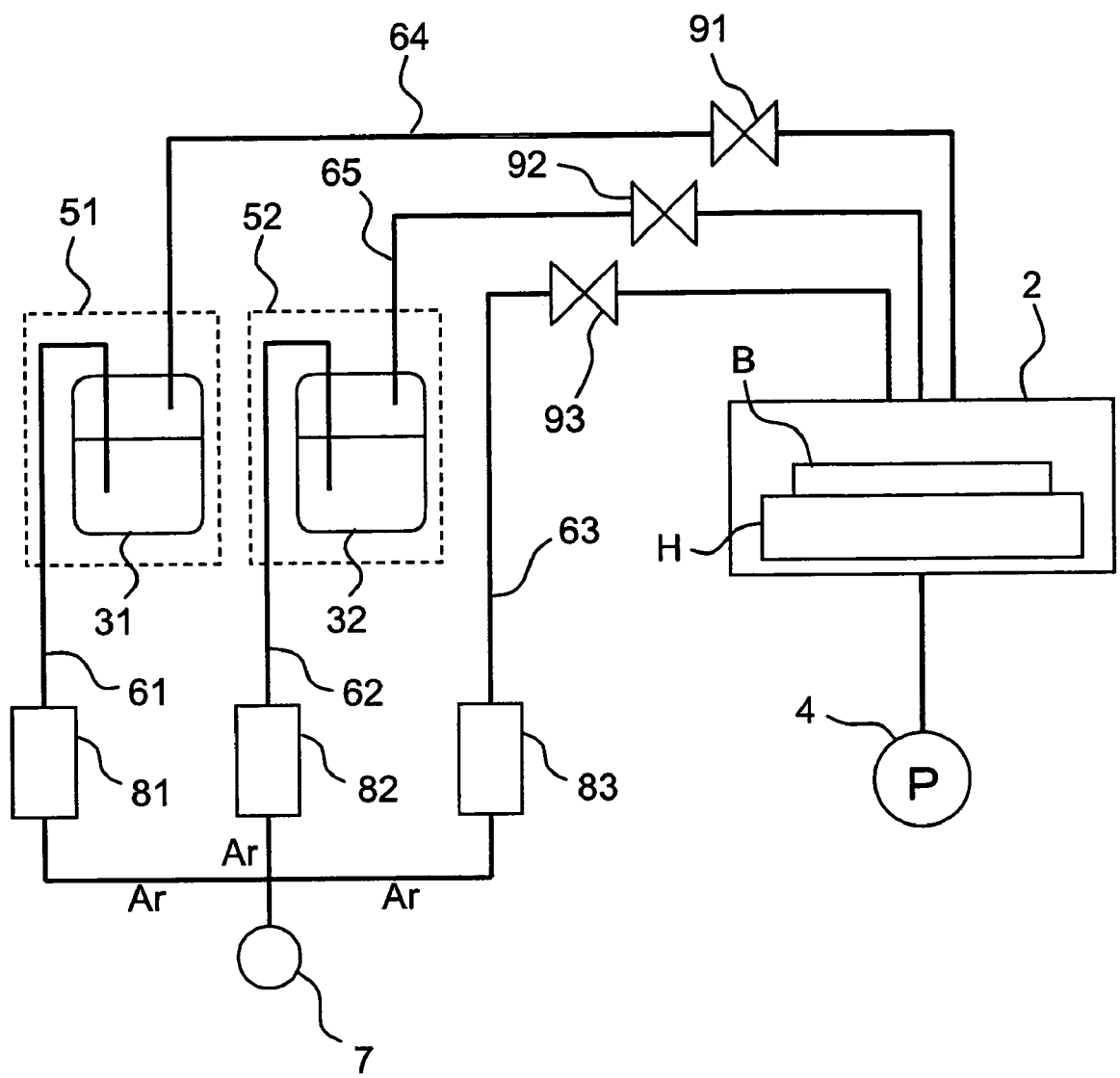
FIG. 1 is a diagram schematically showing the device configuration of a film forming apparatus according to one embodiment of the present invention.

A film forming apparatus 1 according to an embodiment of the present invention is configured to form a metal oxide thin film according to the ALD method. As shown in FIG. 1, the film forming apparatus 1 includes a reaction chamber 2 for allowing the metal oxide thin film to be formed therein, two gas containers 31 and 32 each containing a respective one of two different gases to be fed to the reaction chamber 2, and a pump 4 for keeping the internal pressure of the reaction chamber 2 negative.

The reaction chamber 2 is capable of accommodating therein a substrate B (of Si for example) on which the metal oxide thin film is to be formed. In the reaction chamber 2 the substrate B is placed on an electrical resistance heater H heated.

The gas containers 31 and 32, each formed from stainless steel for example, are accommodated in temperature-controlled chambers 51 and 52, respectively, to keep the temperatures of their respective internal gases constant. The gas container 31 contains a hydrolyzable metallic compound to be used as a source gas, while the gas container 32 contains a hydrate of a metal salt to be used as an oxidizer gas.

The film forming apparatus 1 further has an introduction port 7 for introducing Ar gas as an inert gas into the apparatus 1. The introduction port 7 is connected to the gas containers 31 and 32 via respective carrier gas feed pipes 61 and 62 and to the reaction chamber 2 via a purge gas feed pipe 63. The carrier gas feed pipes 61 and 62 and the purge gas feed pipe 63 are provided with massflow controllers 81, 82 and 83, respectively, for flow rate control. The purge gas feed pipe 63 is further provided with an on-off valve 93 downstream of and in series with the massflow controller 83.

Intermediate the reaction chamber 2 and the gas containers 31, 32 there are provided a source gas feed pipe 64 for feeding the source gas to the reaction chamber 2 and an oxidizer gas feed pipe 65 for feeding the oxidizer gas to the reaction chamber 2. These feed pipes 64 and 65 are provided with on-off valves 91 and 92, respectively.

The following description is directed to a method of forming a compound metal oxide thin film with use of the film forming apparatus 1 thus constructed.

In the preparatory stage, the Si substrate B is placed on the heater H in the reaction chamber 2 and kept at a temperature of from about 200° C. to about 300° C., while at the same time the internal pressure of the reaction chamber 2 is kept negative (0.1-1 Torr for example) by means of the pump 4.

On the other hand, the gas containers 31 and 32 are charged with the source gas and the oxidizer gas, respectively, and then temperature-controlled in the respective temperature-controlled chambers 51 and 52 so that the temperature of each gas is kept constant at about 55° C. to about 65° C. In this embodiment, the source gas comprises, for example, Hf[N(CH$_3$)$_2$]$_4$ (tetradimethylaminohafnium) as a starting material and the oxidizer gas comprises, for example, La(NO$_3$)$_3$·6H$_2$O (lanthanum nitrate hexahydrate).

Further, the massflow controllers 81 to 83 are controlled so that the flow rate of Ar gas flowing in each of the feed pipes 61 to 63 is set to a fixed value (1 L/min for example).

Figure 2:
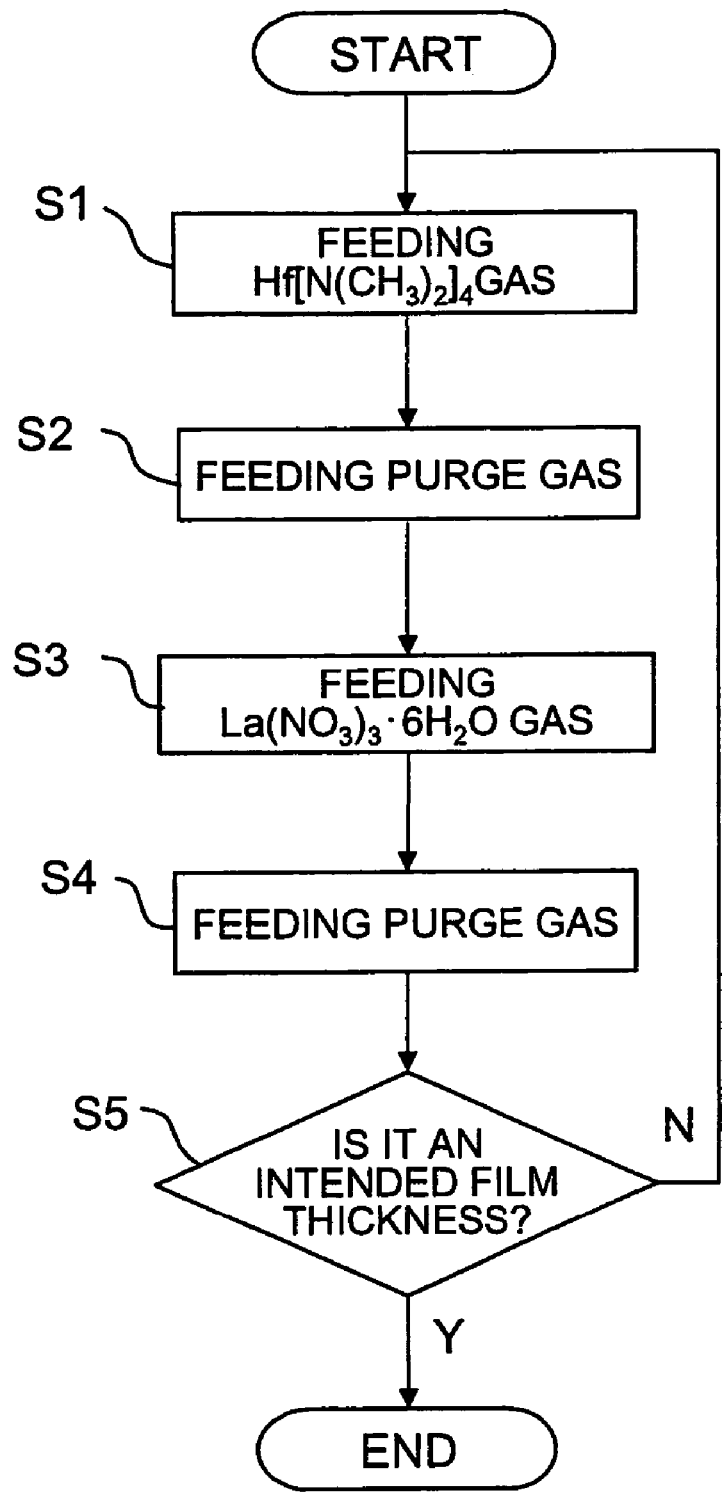
FIG. 2 is a flowchart of a film forming method according the embodiment.

Referring to FIG. 2, the film forming process proceeds as follows.

Figure 4:
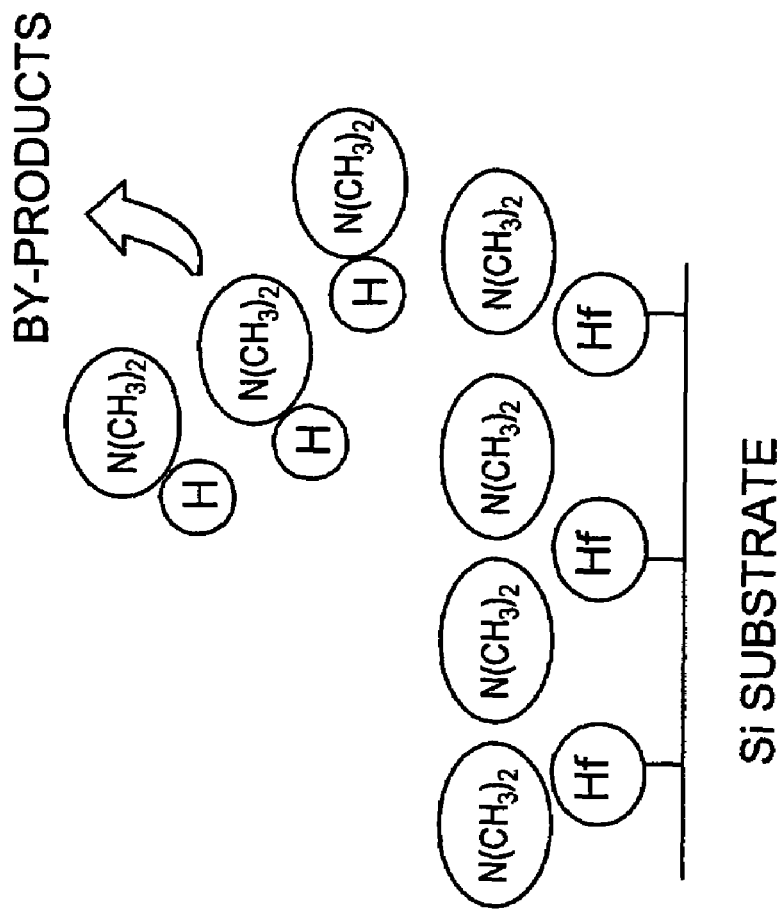
FIG. 4 is a schematic view illustrating a film forming step in the embodiment.

Initially, the on-off valve 91 is opened for a fixed time period to introduce the source gas (Hf[N(CH$_3$)$_2$]$_4$) into the reaction chamber 2 together with the carrier gas (Ar gas) through the source gas feed pipe 64 as shown in FIG. 3 (step S1). As a result of adsorption and replacement at the surface of the Si substrate B, only one monolayer is deposited over the surface of the Si substrate B as shown in FIG. 4.

Thereafter, the on-off valve 91 is closed and the on-off valve 93 opened to force the purge gas (Af gas) into the reaction chamber 2 through the purge gas feed pipe 63 (step S2). The purge gas acts to purge remaining source gas and all the by-products of the reaction out of the reaction chamber 2.

Figure 5:
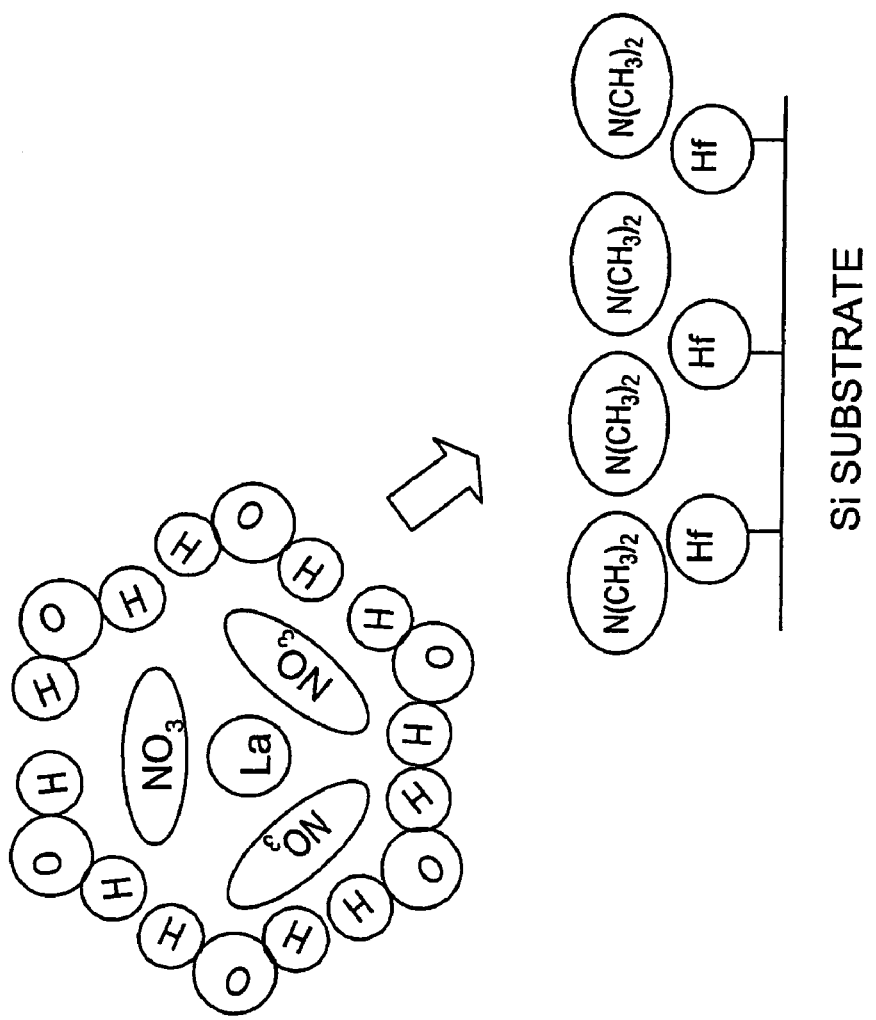
FIG. 5 is a schematic view illustrating a film forming step in the embodiment.
Figure 6:
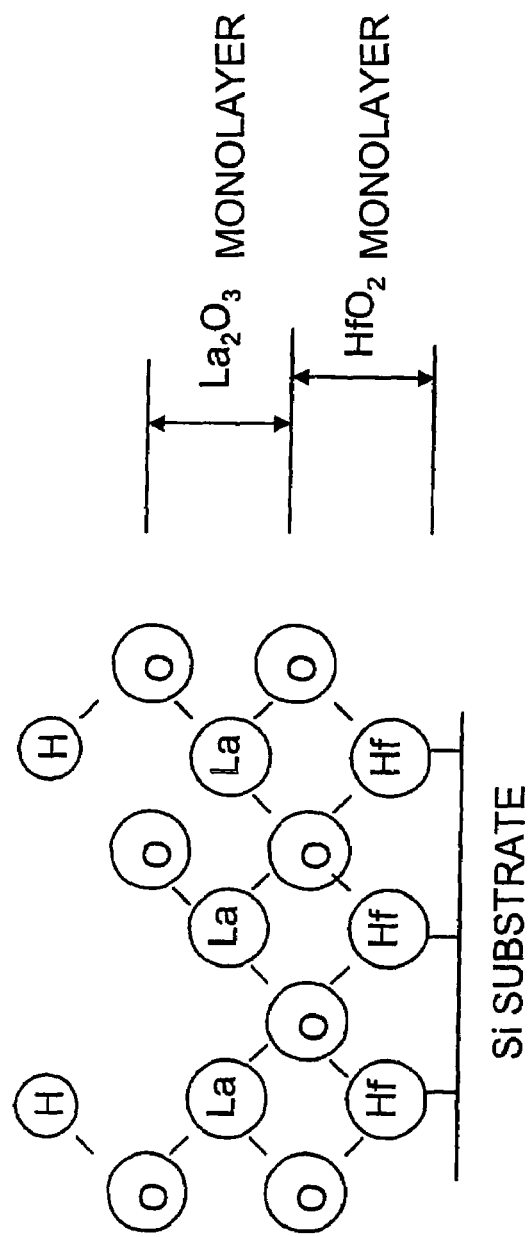
FIG. 6 is a schematic view illustrating a film forming step in the embodiment.

Subsequently, the on-off valve 93 is closed and then the on-off valve 92 is opened for a fixed time period to introduce the oxidizer gas (La(NO$_3$)$_3$·6H$_2$O) into the reaction chamber 2 together with the carrier gas (Ar gas) through the oxidizer gas feed pipe 65 as shown in FIG. 5 (step S3). The oxidizer gas causes the source gas molecules deposited on the Si substrate B to hydrolyze. As a result, only one monolayer comprising, as a major component thereof, La (metal) which has been contained in the oxidizer gas is deposited over Hf (metal) which is contained in the source gas molecules.

Finally, the on-off valve 92 is closed and then the on-off valve 93 is opened to force the purge gas into the reaction chamber 2 (step S4). The purge gas acts to purge remaining oxidizer gas and all the by-products of the replacement reaction out of the reaction chamber 2.

The above-described procedure is repeated plural times (about 20 to 30 times for example) until an intended film thickness is reached. In this way a LaHfO$_x$ film having a desired thickness can be obtained. Note that on-off timing control over the on-off valves 91 to 93 is automatically performed in accordance with switching signals generated from a non-illustrated controller. It is needless to say that the on-off timing control may be performed manually.

The source gas and the oxidizer gas can be selected from the following Table 1.

TABLE 1

| SOURCE GAS | OXIDIZER GAS (METAL SALT HYDRATE) | COMPOUND METAL OXIDE | | |
|---|---|---|---|---|
| $Al(CH_3)_3$ | $La(NO_3)_3.6H_2O$ | $LaAlO_x$ | * | DIELECTRICS |
| $Al(C_2H_5)_5$ | $LaCl_3.7H2O$ | $LaHfO_x$ | * | |
| $AlCl_3$ | | $LaZrO_x$ | * | |
| | $Y(NO_3)_3.6H_2O$ | $LaTaO_x$ | * | |
| $Y(C_{11}H_{18}O_2)_3$ | $Y(NO_3)_3.4H_2O$ | $LaTiO_x$ | * | |
| | $Y_3(SO_4)_3.8H_2O$ | $LaSiO_x$ | * | |
| $Hf[N(CH_3)_2]_4$ | | $YAlO_3$ | | |
| $Hf[N(C_2H_5)_2]_4$ | $Zr(SO_4)_2.4H_2O$ | $YHfO_x$ | | |
| $Hf[NCH_3C_2H_5]_4$ | $Zr(NO_3)_2.5H_2O$ | $YZrO_x$ | | |
| | | $YTaO_x$ | | |
| $Zr[N(CH_3)_2]_4$ | $Ca(NO_3)_2.6H_2O$ | $YTiO_x$ | | |
| | $Ca_2(SO_4)_3.8H_2O$ | $YSiO_x$ | | |
| $Zr[N(C_2H_3)_2]_4$ | $Ca(SO_4)_2.4H_2O$ | $ZrAlO_x$ | | |
| $Zr[NCH_3C_2H_3]_4$ | | $ZrHfO_x$ | | |
| $ZrCl_4$ | $Yb(NO_3)_2.6H_2O$ | $ZrTaO_x$ | | |
| $ZBr_4$ | $YbCl_3.6H_2O$ | $ZrTiO_x$ | | |
| | $Er(NO_3)_3.5H_2O$ | $ZrSiO_x$ | | |
| $Ta[N(CH_3)_2]_5$ | | $CeAlO_x$ | * | |
| $TaCl_2$ | $PrCl_3.7H_2O$ | $CeHfO_x$ | * | |
| $TaBr_5$ | | $CeZrO_x$ | * | |
| $TaF_3$ | $Eu(NO_3)_3.6H_2O$ | $CeTaO_x$ | * | |
| | | $CeTiO_x$ | * | |
| $Ti[N(CH_3)_2]_4$ | $Sm(NO_3)_3.6H_2O$ | $CeSiO_x$ | * | |
| $Ti[N(C_2H_5)_2]_4$ | $Sm_2(SO_4)_3.BH_2O$ | $YbAlO_x$ | * | |
| $TiCl_4$ | | $YbHfO_x$ | * | |
| $TiBr_4$ | $Dy(NO_3)_3.5H_2O$ | $YbZrO_x$ | * | |
| | | $YbTaO_x$ | * | |
| $Fe(C_5H_3)_2$ | $Bi(NO_3)_3.5H_2O$ | $YbTiO_x$ | * | |
| | | $YbSiO_x$ | * | |
| $Cr(C_5H_5)_2$ | $Pb(ClO_4)_2.H_2O$ | $PrAlO_x$ | * | |
| | $Pb(C_2H_3O_2)_2.2H_2O$ | $PrHfO_x$ | * | |
| $Si[N(CH_3)_2]_4$ | | $PrZrO_x$ | * | |
| $HSi[N(CH_3)_2]_3$ | $LiNO_3.H_2O$ | $PrTaO_x$ | * | |
| $Si(CNO)_4$ | | $PrTiO_x$ | * | |
| $Si(CH_3COO)_4$ | $LiSO_4.H_2O$ | $PrSiO_x$ | * | |
| | | $EuAlO_x$ | * | |
| $Cu(C_{11}H_{10}O_2)_2$ | $Ba(NO_3)_2.H_2O$ | $EuHfO_x$ | * | |
| | $Ba(OH)_2.8H_2O$ | $EuZrO_x$ | * | |
| | | $EuTaO_x$ | * | |
| | $Sr(CHO_2)_2.2H_2O$ | $EuTiO_x$ | * | |
| | | $EuSiO_x$ | * | |
| | $FeCl_2.2H_2O$ | $SmAlO_x$ | * | |
| | $FeCl_2.4H_2O$ | $SmHfO_x$ | * | |
| | | $SmZrO_x$ | * | |
| | $Cu(ClO_3)_2.6H_2O$ | $SmTaO_x$ | * | |
| | $Cu(NO_3)_2.3H_2O$ | $SmTiO_x$ | * | |
| | | $SmSiO_x$ | * | |
| | $Mn(NO_3)_2.4H_2O$ | $DyAlO_x$ | * | |
| | $Mn(NO_3)_2.6H_2O$ | $DyHfO_x$ | * | |
| | $MnBr_2.4H_2O$ | $DyZrO_x$ | * | |
| | $MnSO_4.4H_2O$ | $DyTaO_x$ | * | |
| | | $DyTiO_x$ | * | |
| | $ZnSO_4.7H_2O$ | $DySiO_x$ | * | |
| | $Zn(ClO_4)_2.6H_2O$ | $SrZrO_x$ | | |
| | $Zn(NO_3)_26H_2O$ | $SrTiO_3$ | | |
| | | $BiLaTiO_x$ | * | FERRODIELECTRICS |
| | $Ni(NO_3)_26H_2O$ | $PbTiO_3$ | | |
| | $NiSO_46H_2O$ | $Pb(ZrTl)O_3$ | | |
| | | $(PbLa)(ZrTl)O_3$ | * | |
| | $Cr(NO_3)_39H_2O)$ | $LiTaO_3$ | | |
| | | $SrBiTaO_x$ | | |
| | | $BaTiO_3$ | | |
| | | $(BaSr)TiO_3$ | | |
| | | $PbZrO_3$ | | ANTIFERRODIELECTRICS |
| | | $YBa_2Cu_3O_x$ | | SUPERCONDUCTORS |
| | | $(LaBa)CuO_x$ | * | |
| | | $BiSrCuO_x$ | | |
| | | $Y_3Al_2O_{12}$ | | LASER MATERIALS |
| | | $CuFe_2O_4$ | | MAGNETICS |
| | | $MnCr_2O_4$ | | |
| | | $NiFe_2O_4$ | | |
| | | $MnFe_2O_4$ | | |

TABLE 1-continued

| SOURCE GAS | OXIDIZER GAS (METAL SALT HYDRATE) | | COMPOUND METAL OXIDE |
|---|---|---|---|
| | $ZnFe_2O_4$ | | ANTIFERROMAGNETICS |
| | $Y_3Fe_3O_{12}$ | | MAGNETO-OPTICAL |
| | $Eu_3Fe_3O_{12}$ | * | MATERIALS |
| | $Sm_3Fe_3O_{12}$ | * | |
| | $Bi_3Fe_4O_{12}$ | | |

Selection of desired starting materials from the group of sources gases and the group of oxidizer gases shown in Table 1 can afford any desired compound metal oxide thin film or single metal oxide thin film derived from the starting materials. Specifically, various kinds of compound metal oxides or single metal oxides, including dielectrics, ferroelectrics, antiferroelectrics, superconductors, magnetics, antiferromagnetics, and magneto-optical materials, can be obtained according to applications.

Particularly, there is not found any prior art which can form a metal oxide thin film containing a lanthanoid metal by a film forming method based on the ALD method, like the present embodiment.

Thus, the method of forming a metal oxide thin film according to the present embodiment, which uses the source gas comprising a hydrolyzable metallic compound and the oxidizer gas comprising a hydrate of metal salt, makes it possible to form metal oxide thin films of diverse kinds serving many different purposes without increasing the number of gas replacement steps by taking advantage of the ALD method.

Figure 7:
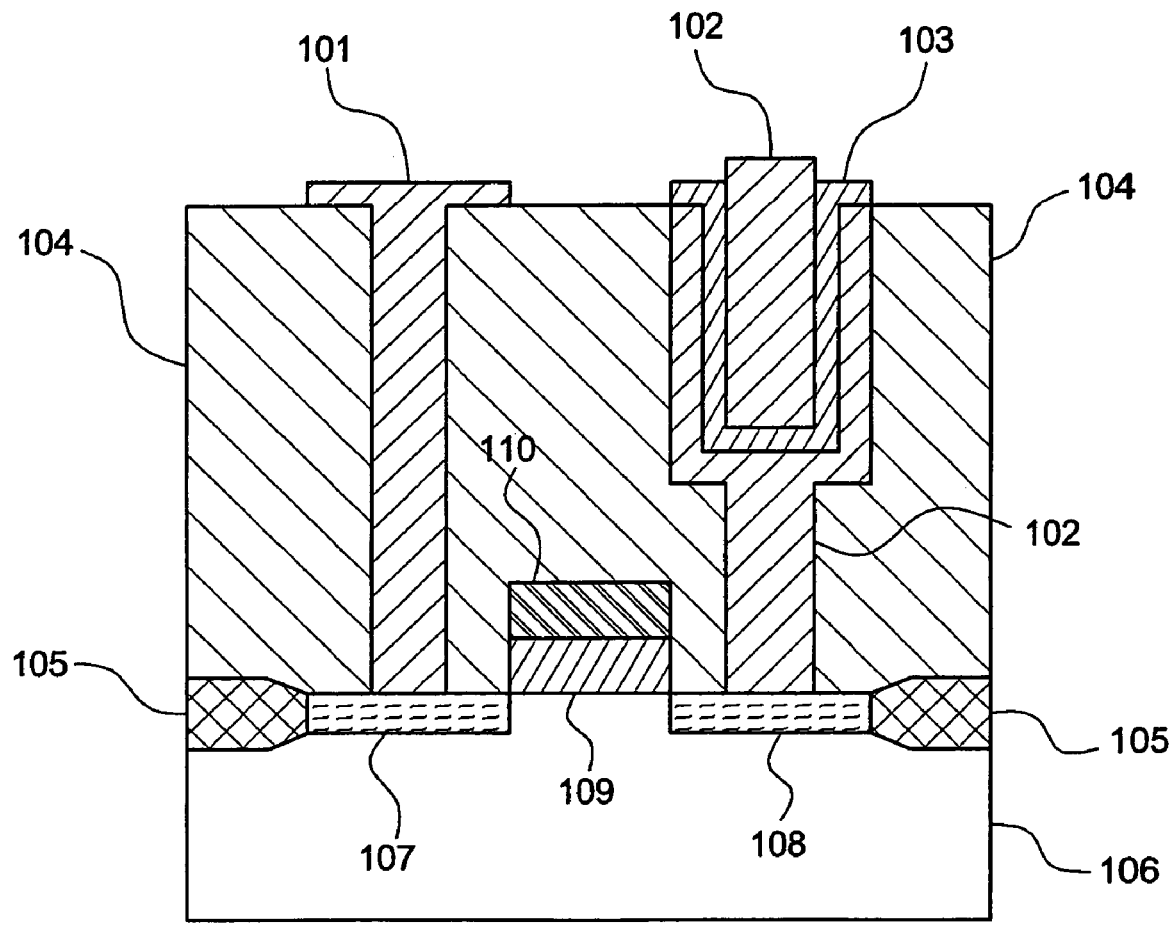
FIG. 7 is a schematic sectional view showing the internal structure of one exemplary transistor having a metal oxide thin film formed by the film forming method according to the embodiment.

With reference to FIG. 7, description will be made a semiconductor device having a metal oxide thin film formed by the method according to the present embodiment.

The semiconductor device shown in FIG. 7 is a transistor having a MIS structure. The semiconductor device includes a single crystal Si substrate (hereinafter will be referred to as Si substrate) 106 having a resistivity of from 0.01 to 15 Ω·cm for example, a device isolation oxide film 105 formed by thermal oxidation of the Si substrate, a gate insulator 109 formed on the Si substrate, a capacitor insulator 103, a lead electrode 101, a capacitor electrode 102, an interlayer insulator 104, source and drain 107 and 108, and a gate electrode 110.

A metal oxide thin film formed by the method according to the present embodiment is used to form each of the gate insulator 109 and capacitor insulator 103 for example.

Thus, an embodiment of the present invention can provide for a semiconductor device, for example, a MOS transistor having a gate insulator of high reliability and high quality.

While the preferred embodiments of the present invention have been described using specific terms, such description is for illustrative purposes only, and it is to be understood that changes and variations may be made without departing from the spirit or scope of the appended claims.

What is claimed is:

1. A metal oxide thin film comprising a lanthanoid metal, which is obtainable by the method comprising: providing a source gas comprising a hydrolyzable metallic compound and an oxidizer gas comprising a hydrate of a metal salt; and alternately feeding the source gas and the oxidizer gas into a reaction chamber in which a substrate is placed.

2. A semiconductor device comprising a metal oxide thin film formed by the method comprising: providing a source gas comprising a hydrolyzable metallic compound and an oxidizer gas comprising a hydrate of a metal salt; and alternately feeding the source gas and the oxidizer gas into a reaction chamber in which a substrate is placed.

3. The semiconductor device comprising a metal oxide thin film of claim 2, formed by the method wherein the hydrate of a metal salt comprises a hydrate of any one selected from the group consisting of a nitrate, a hydrochloride, a sulfate, and a perchlorate, as a major component thereof.

4. A metal oxide thin film comprising a lanthanoid metal, which is obtainable by the method providing a source gas comprising a hydrolyzable metallic compound and an oxidizer gas comprising a hydrate of a metal salt; and alternately feeding the source gas and the oxidizer gas into a reaction chamber in which a substrate is placed, wherein the hydrate of a metal salt comprises a hydrate of any one selected from the group consisting of a nitrate, a hydrochloride, a sulfate, and a perchlorate, as a major component thereof.

* * * * *